United States Patent
Chang et al.

(10) Patent No.: US 8,580,587 B2
(45) Date of Patent: Nov. 12, 2013

(54) LIGHT EMITTING DEVICE AND MANUFACTURING METHOD THEREOF

(75) Inventors: Richard Rugin Chang, Shanghai (CN); Deyuan Xiao, Shanghai (CN)

(73) Assignee: Enraytek Optoelectronics Co., Ltd., Shanghai (CN)

( * ) Notice: Subject to any disclaimer, the term of this patent is extended or adjusted under 35 U.S.C. 154(b) by 202 days.

(21) Appl. No.: 13/128,820

(22) PCT Filed: Dec. 9, 2010

(86) PCT No.: PCT/CN2010/079605
§ 371 (c)(1),
(2), (4) Date: May 11, 2011

(87) PCT Pub. No.: WO2012/045222
PCT Pub. Date: Apr. 12, 2012

(65) Prior Publication Data
US 2012/0132941 A1    May 31, 2012

(30) Foreign Application Priority Data

Oct. 8, 2010 (CN) .......................... 2010 1 0503845

(51) Int. Cl.
*H01L 33/60* (2010.01)
(52) U.S. Cl.
USPC ............ 438/22; 438/26; 438/29; 438/47; 257/98; 257/79; 257/103; 257/ E33.073; 257/E33.056
(58) Field of Classification Search
USPC ................. 257/13, 79–103, 918, 257/E51.018–E51.022, E33.001–E33.077, 257/E33.054, E25.028, E25.032; 438/22–47, 69, 493, 503, 507, 956
See application file for complete search history.

(56) References Cited

U.S. PATENT DOCUMENTS

| | | | |
|---|---|---|---|
| 6,242,764 B1 | 6/2001 | Ohba et al. | |
| 7,196,359 B2 | 3/2007 | Baur et al. | |
| 7,420,221 B2 | 9/2008 | Nagai | |
| 2002/0093023 A1 | 7/2002 | Camras et al. | |
| 2004/0217362 A1* | 11/2004 | Slater et al. | 257/79 |
| 2006/0154454 A1 | 7/2006 | Jeon et al. | |
| 2010/0090232 A1* | 4/2010 | Huang et al. | 257/89 |
| 2010/0141132 A1 | 6/2010 | Shen | |

FOREIGN PATENT DOCUMENTS

| | | |
|---|---|---|
| CN | 1858918 | 11/2006 |
| CN | 101023536 | 8/2007 |
| CN | 101593801 | 12/2009 |
| CN | 101615646 | 12/2009 |
| JP | 2007-305909 A | 11/2007 |
| JP | 2010-056459 A | 3/2010 |

* cited by examiner

OTHER PUBLICATIONS

Extended European Search Report for European Application No. 10829321.8 mailed Oct. 31, 2012.

*Primary Examiner* — Mamadou Diallo
(74) *Attorney, Agent, or Firm* — Merchant & Gould P.C.

(57) ABSTRACT

The present invention provides a light emitting device and a method for manufacturing a light emitting device. The light emitting device includes a base, an LED inversely mounted on the base. The LED includes an LED chip connected to the base and a buffer layer located on the LED. The buffer layer includes a plurality of depressions with complementary pyramid structure on a surface of the buffer layer not face the LED, the surface being a light-exiting surface of the LED. The buffer layer is made from silicon carbide. The light emitting device has a large area of the light-exiting surface and provides a reflecting film on a base, thus improving the luminous efficiency of the light emitting device. Inversely mounting mode is adopt, which is easy to implement.

13 Claims, 6 Drawing Sheets

LIGHT EMITTING DEVICE AND MANUFACTURING METHOD THEREOF

This application is a National Stage Application of PCT/CN2010/079605, filed Dec. 9, 2010, which claims benefit of Chinese Patent Application No. 201010503845.4, entitled filed Oct. 8, 2010, and which applications are incorporated herein by reference. To the extent appropriate, a claim of priority is made to each of the above disclosed applications.

FIELD OF INVENTION

The present invention relates to the semiconductor field, and particularly relates to a light emitting device and manufacturing method thereof.

BACKGROUND OF THE INVENTION

A light emitting diode (LED) is a semiconductor device, which emits different colored light driven by current. Semiconductor material consisting of a compound of the III-V family such as gallium nitride (GaN) has attracted widespread attention because of its wide bandgap, high luminous efficiency, high saturated electron drift velocity, high chemical stability, and huge potential in high brightness blue LED, blue lasers and other optoelectronic fields.

However, conventional LED devices have a problem of low luminous efficiency, which are only several percentage points before LED packaging. Large amount of energy is wasted inside LED devices, causing both energy waste and shorter service life. Therefore, improving the luminous efficiency is very important for LED devices.

Based on the above requirements, many ways of improving the luminous efficiency of LED have been applied to the LED device structure, such as the surface roughening method, metal reflecting mirror structure, etc. In a Chinese patent application (publication number CN1858918A), an LED with an omnidirectional reflector structure to improve the luminous efficiency is disclosed. However, in the method, a film structure including stacked high refractive index layers and low refractive index layers is required to be formed on a substrate. Therefore, the manufacture process of the method is complex.

SUMMARY OF THE INVENTION

It is an object of this invention to provide a light emitting device to improve luminous efficiency.

The present invention provides a light emitting device, including a base and an LED inversely mounted on the base. The LED includes an LED chip connected to the base and a buffer layer located on the LED. The buffer layer includes a plurality of depressions with complementary pyramid structure on a surface of the buffer layer not facing the LED. The surface is a light-exiting surface of the LED. The buffer layer is made from silicon carbide.

The LED chip includes an n-type semiconductor layer, an active layer and a p-type semiconductor layer which are successively located on the buffer layer in a direction from the buffer layer to the base. The active layer is made from InGaN. The n-type semiconductor layer is made from n-type gallium nitride. The p-type semiconductor layer is made from p-type gallium nitride.

The LED further includes a contact layer on the p-type semiconductor layer of the LED chip. A surface of the contact layer contacting the LED chip is a reflecting surface which reflects light emitted from the LED chip to the light-exiting surface of the LED.

The light emitting device further comprises a reflecting film on the base for reflecting light emitted from the LED chip to the light-exiting surface of the LED. The reflecting film is made from barium oxide.

The light emitting device further comprises a first lead and a second lead on the base, the first lead for connecting the LED to a positive terminal of a power supply, the second lead for connecting the LED to a negative terminal of the power supply.

The light emitting device further includes a first electrode connecting the contact layer to the first lead and a second electrode connecting the n-type semiconductor layer to the second lead.

The light emitting device further comprises a cap layer which covers the base and the LED.

To manufacture the light emitting device, the present invention provides a method for manufacturing a light emitting device, including: providing a substrate and forming a plurality of pyramid structures on the substrate; forming an LED on the substrate with the pyramid structures, the LED including a buffer layer and an LED chip which are formed successively on the substrate; removing the substrate; providing a base; and mounting the LED on the base inversely, the buffer layer being made from silicon carbide.

The forming the LED chip on the buffer layer includes: depositing successively an n-type semiconductor layer, an active layer, a p-type semiconductor layer and a contact layer on the buffer layer; etching successively the contact layer, the p-type semiconductor layer and the active layer to form an opening revealing a top of the n-type semiconductor layer; forming a first electrode on the contact layer; and forming a second electrode on the n-type semiconductor layer at a bottom of the opening.

The providing a substrate and forming a plurality of pyramid structures on the substrate includes: providing a substrate; depositing a dielectric layer on the substrate and patterning the dielectric layer to form a grid-shaped hard mask; etching the substrate, with the hard mask as an etching mask, to form pyramid structures; and removing the hard mask.

The substrate is a p-type silicon substrate of (100) lattice plane. The etching the substrate with the hard mask as an etching mask to form pyramid structures includes: wet etching the substrate with tetramethylammonium hydroxide solution to form pyramid structures which include (111) lattice planes of the silicon substrate as side faces and (100) lattice planes of the silicon substrate as bottom faces.

Optionally, in a step of the wet etching the substrate with tetramethylammonium hydroxide solution, the step has an etching time of 20 minutes and an etching temperature of 60~80 degrees Celsius.

Optionally, in each of the pyramid structures which include (111) lattice planes of the silicon substrate as side faces and (100) lattice planes of the silicon substrate as bottom faces, a side face and a bottom face forms an angle of 54.74°.

Optionally, a density of the pyramid structures on the substrate is $4 \times 10^4 \sim 1 \times 10^8$ per square millimeter.

Optionally, the silicon substrate is removed with potassium hydroxide solution.

Optionally, the active layer is made from InGaN. The n-type semiconductor layer is made from n-type gallium nitride. The p-type semiconductor layer is made from p-type gallium nitride.

Optionally, an upper surface of the first electrode on the contact layer and an upper surface of the second electrode on the bottom of the opening are on a same level.

The mounting the LED on the base inversely includes: providing a first lead connected to a positive terminal of a power supply and a second lead connected to a negative terminal of the power supply; and fixing the first electrode to the first lead and the second electrode to the second lead.

Optionally, a reflecting film is formed on a surface of the base on which the LED is inversely mounted. The reflecting film is made from barium oxide.

In comparison with conventional technologies, the present invention has the following advantages:
1. The buffer layer includes a plurality of depressions with complementary pyramid structure on a light-exiting surface of the LED. The depressions increase the area of the light-exiting surface, thus improving the possibility for light emitted from the LED chip to reach the light-exiting surface and improving the luminous efficiency of the light emitting device.
2. The light emitting device further includes a contact layer and a reflecting film which reflect light to a light output direction of the light emitting device, thus further improving the luminous efficiency of the light emitting device.
3. The light emitting device further includes cap layer to converge light, which improves the brightness of the light emitting device.

The method for manufacturing a light emitting device includes: forming a plurality of pyramid structures on the substrate, filling small openings among the pyramid structures to form complementary pyramid structures, and inversely mounting the LED on the base, which is easy to implement.

DESCRIPTION OF THE PREFERRED EMBODIMENTS

Hereunder, the present invention will be described in detail with reference to embodiments, in conjunction with the accompanying drawings.

Embodiments to which the present invention is applied are described in detail below. However, the invention is not restricted to the embodiments described below.

As described in the background, in conventional technology, to improve the luminous efficiency of LED, a film structure including stacked high refractive index layers and low refractive index layers is required to be formed on a substrate, which leads to a complex manufacture process.

To solve the above problem, the present invention provides a light emitting device, which includes an LED inversely mounted on the base. The LED includes a plurality of pyramid structures on a light-exiting surface of the LED, which increases the area of the light-exiting surface and improves the possibility for light emitted from an active layer to reach the light-exiting surface, the external quantum efficiency of the LED, and the luminous efficiency of the LED.

Figure 1:
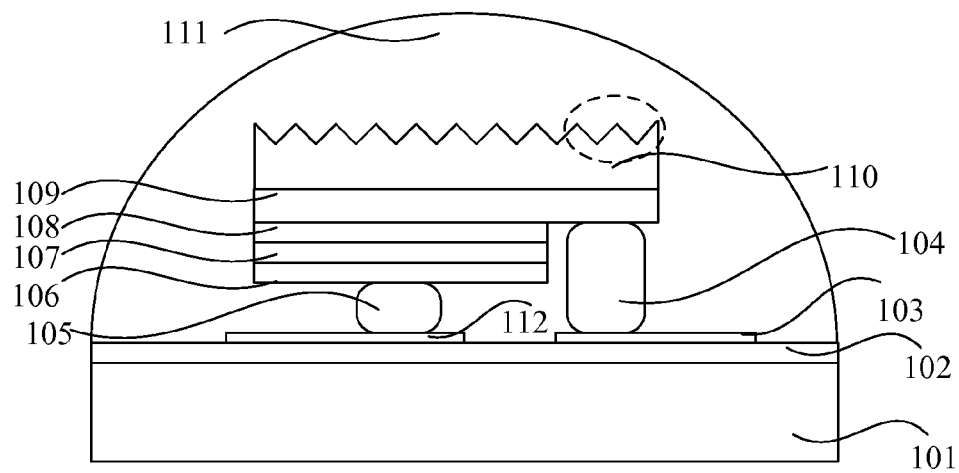
FIG. 1 is a sectional view of an embodiment of the light emitting device of the present invention.

Referring to FIG. 1, a sectional view of an embodiment of the light emitting device of the present invention is illustrated. The light emitting device includes: a base 101, a reflecting film 102 on the base 101, a first lead 112 and a second lead 103, an LED inversely mounted on the first lead 112 and the second lead 103, a cap layer 111 covers the reflecting film 102 and the LED.

The base 101 is used to support the LED. In embodiments of the present invention, the base 105 is made from copper, aluminum, silicon, or aluminum nitride, etc.

The reflecting film 102 is used to reflect light emitted from the LED to the light output direction of the light emitting device, to improve the luminous efficiency of the light emitting device and increase the lightness of the light emitting device. Specifically, the material of reflecting film 102 is barium oxide.

The first lead 112 is used to connect the LED to the positive terminal of a power supply (not shown); the second lead 103 is used to connect the LED to the negative terminal of the power supply (not shown). Specifically, the first lead 112 and the second lead 103 are made from conductive materials such as copper or aluminum, etc.

The LED includes a buffer layer 110, an n-type semiconductor layer 109, an active layer 108, a p-type semiconductor layer 107, and a contact layer 106 successively from top to bottom.

Figure 1A:
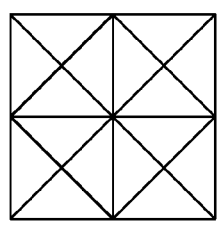
FIG. 1a is a top view of complementary pyramid structures shown in a circle in FIG. 1.

The buffer layer 110 includes a plurality of depressions on another surface of the n-type semiconductor layer 109. The depressions are of complementary pyramid structure (FIG. 1a is a top view of complementary pyramid structures shown in a circle in FIG. 1). Specifically, the complementary pyramid structures are formed by filling the small openings among the pyramid structures. The depressions with complementary pyramid structure increases the area of the light-exiting surface and improves the possibility for light emitted from an LED chip to reach the light-exiting surface and the luminous efficiency of the LED. Specifically, the buffer layer 110 is made from silicon carbon.

The n-type semiconductor layer 109, the active layer 108, and the p-type semiconductor layer 107 constitute an LED chip. In an embodiment of the present invention, the material of the n-type semiconductor layer 109 is n-type gallium nitride, and the active layer 108 is a multi-quantum well active layer. Specifically, the active layer 108 is made from InGaN, to produce blue light with wavelength of 470 nm; the p-type semiconductor layer 107 is p-type gallium nitride.

The contact layer 106 is used to electrically connect the p-type semiconductor layer 107 to a positive terminal of a power supply. The area of the contact layer 106 is large to reduce contact resistance. Preferably, the lower surface of the contact layer 106 is a reflecting surface, which reflects light emitted from LED chip to the light-exiting surface. Specifically, the material of the contact layer 106 is gold or nickel, etc, and the thickness of the contact layer 106 is from 50 to 100 nm.

The LED further includes a first electrode 105 located between the contact layer 106 and the first lead 112, which is to electrically connect the p-type semiconductor layer 107 to the first lead 112.

The n-type semiconductor layer 109 includes an extended part which is not covered by the active layer 108, the p-type semiconductor layer 107 and the contact layer 106. The LED further includes a second electrode 104 with one end connected to the extended part of the n-type semiconductor layer 109 and the other end connected to the second lead 103, thereby achieving electrical connections between the n-type semiconductor layer 109 and the second lead 103.

The cap layer 111 covers the LED and the reflecting film 102. The cap layer 111 is provided with a lens structure in a light output direction of the LED. The lens structure converges light from LED, which improves the lightness of the light emitting device. In an embodiment, the cap layer 111 is made from materials such as colophony. The cap layer 111 can also protect the LED.

Figure 2:
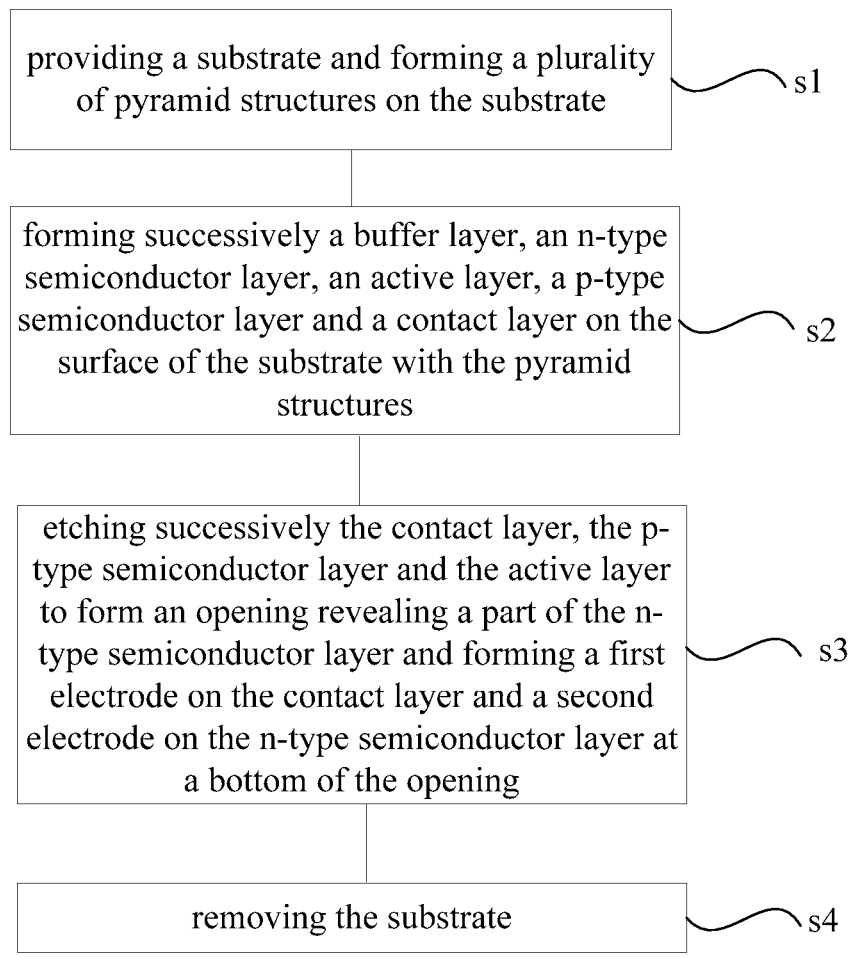
FIG. 2 is a flow diagram of an embodiment of the method for manufacturing a light emitting device in the present invention.

There is also provided a method for manufacturing a light emitting device in the present invention. Referring to FIG. 2, the method includes:

S1, providing a substrate, and forming a plurality of pyramid structures on the substrate;

S2, forming successively a buffer layer, an n-type semiconductor layer, an active layer, a p-type semiconductor layer and a contact layer on the surface of the substrate with the pyramid structures;

S3, etching successively the contact layer, the p-type semiconductor layer and the active layer to form an opening revealing a part of the n-type semiconductor layer and forming a first electrode on the contact layer and a second electrode on the n-type semiconductor layer at a bottom of the opening; and S4, removing the substrate.

Figure 3:
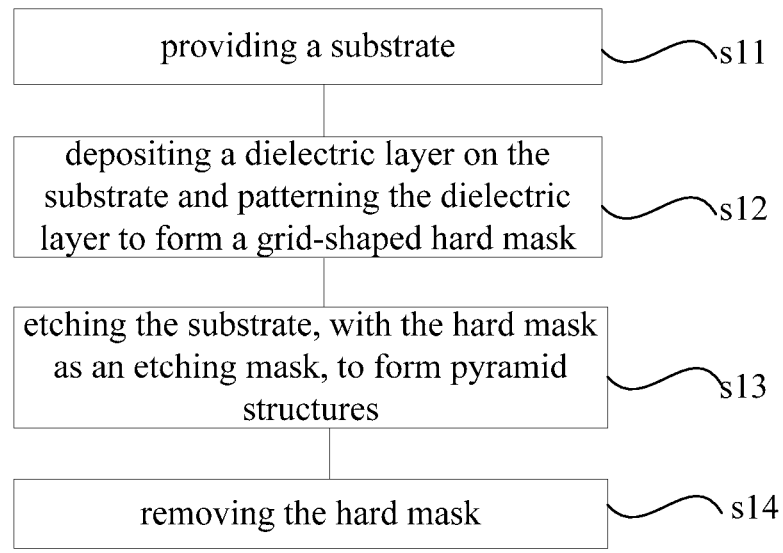
FIG. 3 is a flow diagram of an embodiment of the step S1 in FIG. 2.

Referring to FIG. 3, step S1 in FIG. 2 further includes:

S11, providing a substrate;

S12, depositing a dielectric layer on the substrate and patterning the dielectric layer to form a grid-shaped hard mask;

S13, etching the substrate, with the hard mask as an etching mask, to form pyramid structures; and S14, removing the hard mask.

In the step S11, the substrate 201 is a p-type silicon substrate of (100) lattice plane. The silicon substrate has a resistivity of 1~20 ohms-centimeters.

Figure 4:
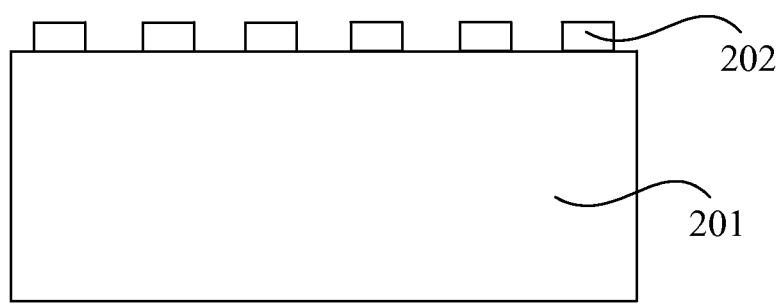
FIG. 4 to FIG. 10 are sectional views of a light emitting device in an embodiment of the method for manufacturing a light emitting device.

Referring to FIG. 4, in step S12, the dielectric layer is made from silicon dioxide. The hard mask 202 on the substrate 201 is formed by dry etching the dielectric layer.

Figure 5:
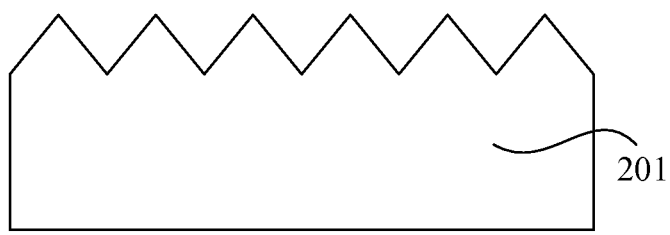

Referring to FIG. 5, in steps S13 and S14, wet etching the substrate 201 with tetramethylammonium hydroxide (TMAH) to form pyramid structures with (111) lattice planes as side faces and (100) lattice planes as bottom faces on the silicon substrate. Specifically, the wet etching has an etching time of 20 minutes and an etching temperature of 60~80° C. Specifically, each grid-shaped hard mask corresponds to spires of the pyramid structures, the pyramid structures are arranged in matrix, the bottom plane in each pyramid structure is a square, and the side plane and bottom plane in each pyramid structure forms an angle of 54.74°

If the density of the pyramid structures is too large, the pyramid structures formed by etching are not high enough; and if the density of the pyramid structures is too small, the number of the pyramid structures is not enough, which can not increase the area of the light-exiting surface of the LED as required. The density of the pyramid structures is $4 \times 10^4 \sim 1 \times 10^8$ per square millimeter normally. The density of the pyramid structures can be controlled by the lattice density of the grid-shaped hard mask in the manufacturing method, so as to form enough pyramid structures with proper dimensions. Preferably, each pyramid structure has a bottom square with a side length of 5 µm, and a height of 3.53 µm from the top to the bottom.

The hard mask 202 made from silicon dioxide is then removed with hydrofluoric acid solution, which forms the substrate 201 with pyramid structures.

Figure 6:
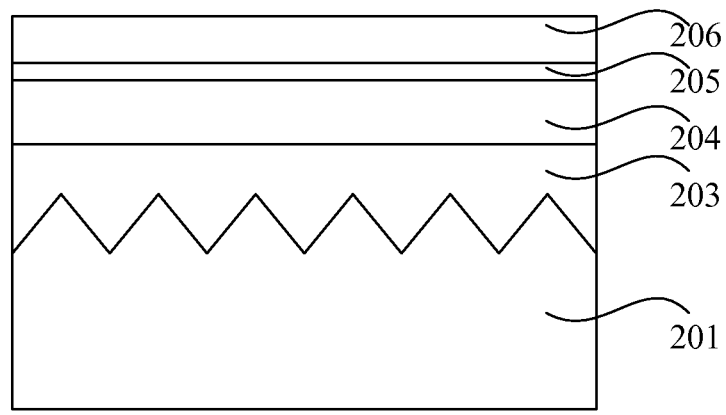

Referring to FIG. 6, in step S2, the buffer layer 203, n-type semiconductor layer 204, active layer 205 and p-type semiconductor layer 206 are formed successively by Metal-organic Chemical Vapor Deposition (MOCVD).

In one embodiment, during depositing the buffer layer 203, small openings among the pyramid structures on the substrate 201 are filled first till the pyramid structures are covered, which forms a plurality of depressions with complementary pyramid structure at the bottom of the buffer layer 203.

In this embodiment, the side faces of each pyramid structure are silicon of (111) lattice plane. The material of the buffer layer 203 is silicon carbide, which matches the lattice constant of silicon.

The buffer layer 203 fully covers the pyramid structure, and preferably, the buffer layer 203 has a thickness of 10~100 µm.

The n-type semiconductor layer 204 is n-type gallium nitride; the active layer 205 is a multi-quantum well active layer. Specifically, the active layer 205 is made from InGaN, to produce blue light with wavelength of 470 nm; the p-type semiconductor layer 206 is p-type gallium nitride.

Figure 7:
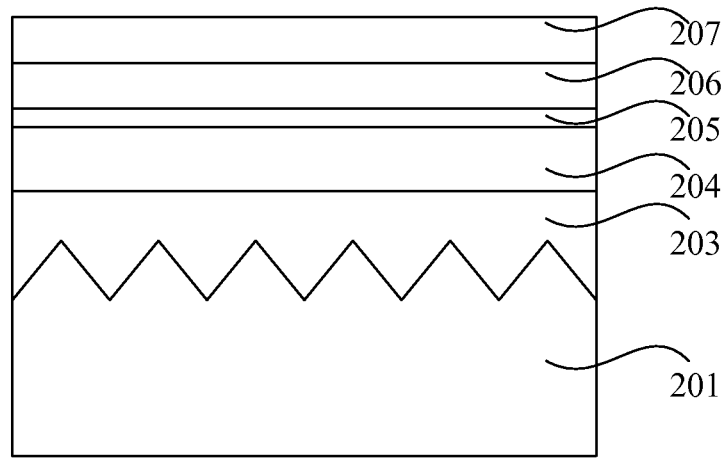

Referring to FIG. 7, a contact layer 207 is formed on the p-type semiconductor layer 206. Specifically, the contact layer 207 is made from metal material such as gold or nickel, etc. The contact layer 207 is formed by physical vapor deposition (PVD) or electron beam evaporation. The thickness of the contact layer 207 is from 50 to 100 nm.

Figure 8:
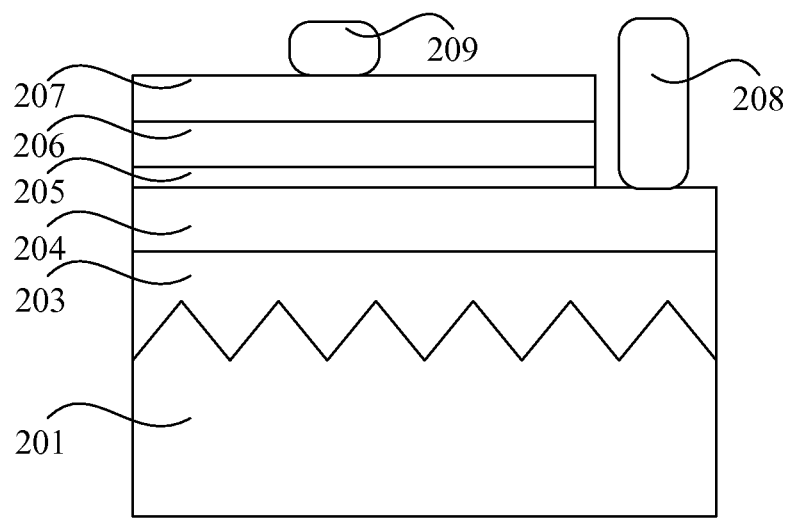

Referring to FIG. 8, in step S3, an opening revealing a top of the n-type semiconductor layer is formed by etching successively the contact layer 207, the p-type semiconductor layer 206 and the active layer 205 using dry etching A first electrode 209 is formed on the contact layer 207 and a second electrode 208 is formed on the n-type semiconductor layer at a bottom of the opening. The upper surface of the first electrode 209 and the second electrode 208 are on a same level. Specifically, the first electrode 209 and the second electrode 208 are made from gold, aluminium or nickel.

Figure 9:
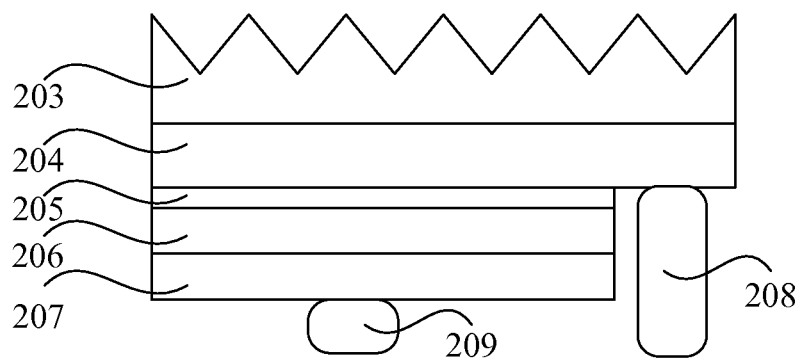

Referring to FIG. 9, in step S4, the silicon substrate 201 is removed with potassium hydroxide solution. It should be noted that the silicon substrate 201 can be removed with other solutions which have high selection ratio to silicon to avoid removing other materials. The manufacture of LED is finished.

Figure 10:
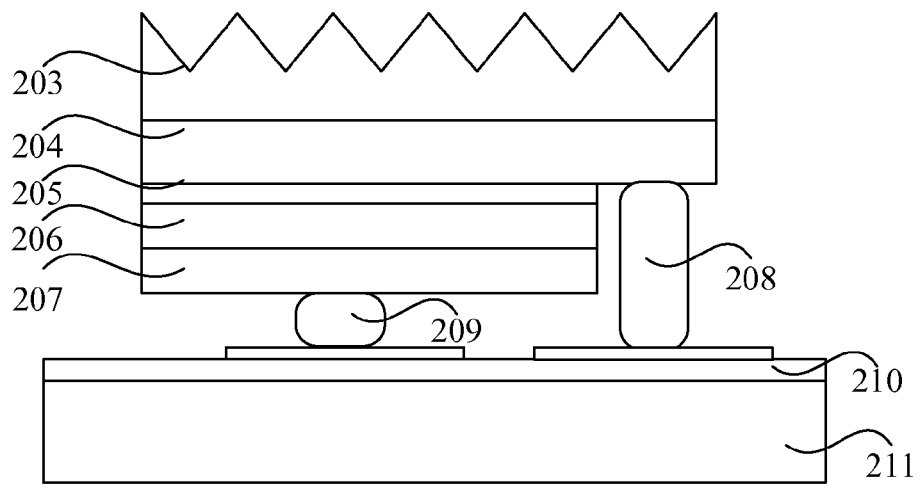

The method for manufacturing a light emitting device also includes steps of encapsulation. Referring to FIG. 10, the steps of encapsulation includes: providing a base 211, forming a reflecting film 210 on the base 211, and forming a first lead on the reflecting film 210 connected with the positive terminal of the power supply and a second lead on the reflecting film 210 connected with the negative terminal of the power supply. The LED is then inversely mounted on the reflecting film 210. Specifically, the LED is mounted on the reflecting film 210 in a way that the buffer layer 203 faces the light output direction, the first electrode 209 is fixed to the first lead and the second electrode 208 is fixed to the second lead.

The method for manufacturing a light emitting device also includes forming a cap layer (not shown) which covers the LED and the reflecting film 210. Preferably, the cap layer is provided with a lens structure in a light output direction of the LED. The lens structure converges light from LED. The cap layer is made from materials such as colophony.

The method for manufacturing a light emitting device is finished.

In conclusion, the present invention provides a light emitting device, including an LED with a light-exiting surface provided with depressions with complementary pyramid structure. The depressions with complementary pyramid structure increase the area of the light-exiting surface and improve the luminous efficiency of the light emitting device.

The light emitting device further includes a contact layer and a reflecting film which reflect light to a light output direction of the light emitting device, thus further improving the luminous efficiency of the light emitting device.

The light emitting device further includes cap layer to converge light, which improves the brightness of the light emitting device.

The method for manufacturing a light emitting device includes: forming a plurality of pyramid structures on the substrate, filling small openings among the pyramid structures to form complementary pyramid structures, and inversely mounting the LED on the base. The method is easy to implement.

Although the present invention has been illustrated and described with reference to the preferred embodiments of the present invention, those ordinary skilled in the art shall appreciate that various modifications in form and detail may be made without departing from the spirit and scope of the invention.

The invention claimed is:

1. A method for manufacturing a light emitting device comprising:
   providing a substrate and forming a plurality of pyramid structures on the substrate;
   forming an LED on the substrate with the pyramid structures, the LED including a buffer layer and an LED chip which are formed successively on the substrate;
   removing the substrate;
   providing a base; and
   mounting the LED on the base inversely, the buffer layer being made from silicon carbide.

2. The method for manufacturing a light emitting device of claim 1, wherein the forming of the LED chip on the buffer layer includes:
   depositing successively an n-type semiconductor layer, an active layer, a p-type semiconductor layer and a contact layer on the buffer layer;
   etching successively the contact layer, the p-type semiconductor layer and the
   active layer to form an opening revealing a top of the n-type semiconductor layer; forming a first electrode on the contact layer; and
   forming a second electrode on the n-type semiconductor layer at a bottom of the opening.

3. The method for manufacturing a light emitting device of claim 1, wherein the providing a substrate and forming a plurality of pyramid structures on the substrate includes:
   providing a substrate;
   depositing a dielectric layer on the substrate and patterning the dielectric layer to form a grid-shaped hard mask;
   etching the substrate, with the hard mask as an etching mask, to form pyramid structures; and
   removing the hard mask.

4. The method for manufacturing a light emitting device of claim 3, wherein the substrate is a p-type silicon substrate of (100) lattice plane; and
   the etching the substrate with the hard mask as an etching mask to form pyramid structures includes: wet etching the substrate with tetramethylammonium hydroxide solution to form pyramid structures which include (111) lattice planes of the silicon substrate as side faces and (100) lattice planes of the silicon substrate as bottom faces.

5. The method for manufacturing a light emitting device of claim 4, wherein in a step of the wet etching the substrate with tetramethylammonium hydroxide solution, the step has an etching time of 20 minutes and an etching temperature of 60~80 degrees Celsius.

6. The method for manufacturing a light emitting device of claim 4, wherein in each of the pyramid structures which include (111) lattice planes of the silicon substrate as side faces and (100) lattice planes of the silicon substrate as bottom faces, a side face and a bottom face forms an angle of 54.74°.

7. The method for manufacturing a light emitting device of claim 4 wherein a density of the pyramid structures on the substrate is $4\times10^4 \sim 1\times10^8$ per square millimeter.

8. The method for manufacturing a light emitting device of claim 4, wherein the silicon substrate is removed with potassium hydroxide solution.

9. The light emitting device of claim 1, wherein the active layer is made from InGaN, the n-type semiconductor layer is made from n-type gallium nitride, and the p-type semiconductor layer is made from p-type gallium nitride.

10. The method for manufacturing a light emitting device of claim 2, wherein an upper surface of the first electrode on the contact layer and an upper surface of the second electrode on the bottom of the opening are on a same level.

11. The method for manufacturing a light emitting device of claim 10, wherein the mounting the LED on the base inversely includes:
   providing a first lead connected to a positive terminal of a power supply and a second lead connected to a negative terminal of the power supply; and
   fixing the first electrode to the first lead and the second electrode to the second lead.

12. The method for manufacturing a light emitting device of claim 1, wherein a reflecting film is formed on a surface of the base on which the LED is inversely mounted.

13. The method for manufacturing a light emitting device of claim 12, wherein the reflecting film is made from barium oxide.

* * * * *